(12) United States Patent
Blatz

(10) Patent No.: US 6,516,026 B1
(45) Date of Patent: Feb. 4, 2003

(54) DATA TRANSMISSION EQUIPMENT

(75) Inventor: Werner Blatz, Leingarten (DE)

(73) Assignee: Temic Semiconductor GmbH, Heilbronn (DE)

(*) Notice: Subject to any disclaimer, the term of this patent is extended or adjusted under 35 U.S.C. 154(b) by 0 days.

(21) Appl. No.: 09/284,274
(22) PCT Filed: Oct. 1, 1997
(86) PCT No.: PCT/EP97/05414
§ 371 (c)(1), (2), (4) Date: Jun. 21, 1999
(87) PCT Pub. No.: WO98/17008
PCT Pub. Date: Apr. 23, 1998

(30) Foreign Application Priority Data

Oct. 12, 1996 (DE) .......................................... 196 42 149

(51) Int. Cl.[7] ................................................ H04L 1/00
(52) U.S. Cl. ...................... 375/224; 375/340; 359/111; 370/241
(58) Field of Search ................................ 375/354, 224, 375/340; 359/111; 370/241

(56) References Cited

U.S. PATENT DOCUMENTS 3,891,319 A 6/1975 Meinke et al.
4,366,378 A 12/1982 Simons
4,731,586 A 3/1988 Perkins
5,877,627 A * 3/1999 Fischer et al. .............. 324/239

FOREIGN PATENT DOCUMENTS

DE 2301945 5/1974
DE 3425335 1/1986

OTHER PUBLICATIONS

Soviet Inventions Illustrated SU10850000–A Jan. 23, 1985.
"Impulse Noise Tolerance Data Transmission Code" Research Disclosure No. 260, Dec. 1985, p. 603.
"Ambient Light Noise and its Effect on Receiver Design for Indoor Wireless Optical Links" Boucouvaias, Jun. 23, 1996, pp. 1472–1476.

* cited by examiner

Primary Examiner—Amanda T. Le
(74) Attorney, Agent, or Firm—Robert Kinberg; Venable, LLP

(57) ABSTRACT

A method of and device for recognizing a network-synchronous interfering signal during a data transmission in which pauses occur between useful signals, with the duration of a shortest pause being Tp and a main frequency being f are disclosed. The method includes the steps of defining a time span Td being shorter than the shortest pause Tp, but longer than the longest period 1/f or ½ f, of a network-synchronous interfering station; determining whether pauses occur that are longer than Td during a time period T check>Td; and interpreting an occurrence of pauses as the presence of a useful signal without a network-synchronous interfering signal, and interpreting a lack of an occurrence of pauses as the presence of an interfering signal.

20 Claims, 1 Drawing Sheet

DATA TRANSMISSION EQUIPMENT

BACKGROUND OF THE INVENTION

The invention relates to a method of recognizing network-synchronous interfering signals during a data transmission, in which pauses occur between useful signals, with the period of the shortest pause being Tp and the main frequency being f.

A method of this type, and a corresponding device, the two having an analog function, are known.

For the remote control of, for example, devices in the field of entertainment electronics, such as televisions or CD players, or for the remote control of garage doors, the user actuates infrared (IR) transmitters whose IR light is received by a receiving device, and triggers the desired switching process or setting process by pressing a specific IR transmitter key. While IR light is frequently used in such applications, the invention is not limited to this type of information transmission through light, but is also suitable for UV light or visible light, as well as for high-frequency information transmission.

The receiving device receives not only the light transmitted by the IR transmitter, but also the light of other light sources that are fed by the AC network normally employed in households. These interferences are therefore network-synchronous interferences that occur at a single-phase main frequency of, for example, 50 Hz, depending on the interfering station, with a frequency of 50 Hz or 100 Hz.

A fairly large time constant is necessary for recognizing network-synchronous interferences with a relatively high reliability. In the known analog circuits, this time constant requires a relatively large capacitor, which must be disposed, as an additional component, outside of the actual electronic circuit. Fully-integrated solutions without external components are also known; these, however, do not permit a reliable distinction between useful and interfering signals.

SUMMARY OF THE INVENTION

It is the object of the invention to create a circuit arrangement that permits all components of the circuit to be housed in a small space, notably requires no voluminous, external capacitor, and, at most, requires the connection of a signal receiver, i.e., an IR detector photodiode for IR signal transmission.

According to the invention, this object is accomplished in that a time span Td is defined, which is shorter than the shortest pauses Tp, but longer than the longest period 1/f or ½ f of a network-synchronous interfering station; it is checked whether, during a time period T check>Td, preferably a multiple of Td, for example four times Td, pauses occur that are longer than Td; and such an occurrence of pauses is interpreted as the presence of a useful signal without network-synchronous interferences (interfering signals), and no such occurrence of pauses is interpreted as the presence of interferences.

An advantage is that the circuit can operate extensively digitally, so it can be accommodated in a small housing, which means a reduction in costs and new application possibilities (e.g. in video cameras). In contrast, known photomodules require, as a further external component, a further resistor in addition to the aforementioned capacitor.

Another advantage is that the current consumption can be significantly reduced with improved functioning.

Further advantages of the invention are that network-synchronous interfering signals can be unambiguously distinguished from conventionally-used infrared data-transmission signals. This assures a high transmission reliability, and it is possible to transmit data as long as the amplitude of the useful signal is larger than that of the interfering signal.

With the invention, it is also possible to use fewer photomodules and IR pre-amplifiers, which results in cost savings. Because of the digital embodiment, the necessary surface for the circuit (the chip surface in the embodiment as an integrated circuit) can be reduced, which also results in cost savings. The current consumption can be reduced, and can particularly be tailored to the customer's requirements. Furthermore, the outlay for external circuitry (a capacitor) can be avoided, which contributes to the cost reduction and the small design.

The invention can be applied when the useful signal and the interfering signal meet specific marginal conditions. In accordance with the invention, a distinction is made between an interfering signal and a (not necessarily always present) useful signal based on the occurrence of the signals over time. Network-synchronous interferences (due to fluorescent lamps, electronically-clocked energy-saving lamps, etc.) occur periodically. The repetition period of such an interference is equal to the line period of the used AC network, or equal to half of the line period (in Germany, the repetition period T=20 ms or T=10 ms).

The data formats usually used in IR remote control comprise a block of data bits followed by a pause. The temporal length of the block of data bits is usually 10 ms to 50 ms. The pause duration Tp is normally longer than 30 ms.

The distinction between interfering signals and useful signals is based on the following distinction criterion:

A time Td is defined, which is shorter than the shortest pauses, but longer than the longest period, of a network-synchronous interfering station. The shortest pauses Tp are usually 30 ms long. The longest period of a network-synchronous interfering station is T=20 ms (corresponding to a mains frequency f=50 Hz).

If Td=24 m is selected, the two aforementioned conditions are met. The received signals are now tested with respect to their behavior over time. An interfering station is present if no pauses longer than Td occur in a lengthy time segment. A useful signal is present if pauses longer than Td occur in a lengthy time segment. A digital circuit can be employed to make this distinction.

If it is further ensured that the amplitude of the network-synchronous interferences is smaller at the location of the above-mentioned distinction than the amplitude of the useful signals, in one embodiment of the invention, the use of voltage thresholds varying in magnitude can ensure that only the useful signal is supplied for further evaluation; in accordance with another embodiment of the invention, an amplification regulation can be used in a steady-state regulating procedure to ensure that the interfering signal has such a level that the useful signal can be separated especially simply from the interfering signal based on amplitude, and can be supplied alone for evaluation.

An amplitude of the interfering signals that is smaller compared to the useful signal may be attained through filtering, and/or, in particularly critical cases, an arrangement of the IR signal receiver that is somewhat protected from external light sources, and the user's use of an IR transmitter having a directional effect, as is provided anyway, and therefore the most target-precise possible transmission to the IR receiver, in which case, of course, the range cannot exceed a predetermined measure.

The invention also relates to a device for recognizing network-synchronous interfering signals during data transmission, in which pauses occur between useful signals, with the duration of the shortest pause being Tp and the mains frequency being f. To accomplish the stated object, means are provided for defining a time span Td that is shorter than the shortest pauses Tp, but longer than the longest period 1/f or ½ f, of a network-synchronous interfering station; means are provided for checking whether, during a time period T check>Td, preferably a multiple of Td, for example four times Td, pauses occur that are longer than Td; and such an occurrence of pauses is interpreted as the presence of a useful signal without network-synchronous interferences (interfering signals), and no such occurrence of pauses is interpreted as the presence of interferences.

In an embodiment of the invention, an amplitude threshold is provided in the data path of the useful signal, the threshold only permitting an evaluation of the useful signal if its amplitude at the output of a band-pass is larger than that of the interfering signal. This advantageously permits a separation of interferences out of the path of the useful signal.

In an embodiment of the invention, an amplitude threshold is provided in the evaluation path of the interfering signals, the threshold being lower than the aforementioned amplitude threshold in the data path of the useful signal. Even if interferences are present, this provision advantageously permits the evaluation of the interferences such that they cannot be recognized as interferences if the amplitude is sufficiently small.

In an embodiment of the invention, an amplifier whose amplification can be regulated is switched into the signal path of the useful signals and interference signals, and its amplification is regulated such that, in the temporal means, the amplitude of the interfering signal is identical to the threshold value of the amplitude threshold for the interfering signals. This advantageously permits the regulation of the interference amplitude such that it has a virtually constant value that is lower than the first amplitude threshold mentioned above, because of which interferences can be kept out of the path of the useful signal even better.

In an embodiment of the invention, the regulation has a device that increases the amplification of the amplifier when no interferences are recognized, and reduces it when interferences are recognized. This advantageously permits a simple and reliable regulation.

The signals that can be processed with the method and device of the invention can vary greatly. IR remote control systems generally operate at a carrier frequency in the range between 30 kHz and 70 kHz. For the following example, it is assumed that a carrier frequency of 30 kHz is used.

By way of example, it should further be assumed that an IR signal is generated by the user with the aid of his hand-held remote-control device as follows: After an arbitrarily-short pressing of a key that is intended, for example, to switch to another channel in a television, a sequence of ten so-called bursts is generated. Each burst comprises 15 sinusoidal oscillations having a frequency of 30 kHz, followed by a pause corresponding to the length of 30 such rectangular oscillations, and finally, again, 15 rectangular oscillations. The information that is to be transmitted is determined by the mutual spacing between the second and first bursts, the third and second bursts, etc. The ten bursts require a total time of about 10 ms to 50 ms.

Further features and advantages of the invention ensue from the following description of embodiments of the invention in conjunction with the drawing, which shows details that are essential to the invention, and the claims. The individual features can be realized alone, in and of themselves, or in arbitrary combinations in an embodiment of the invention.

DETAILED DESCRIPTION OF THE INVENTION

Figure 1:
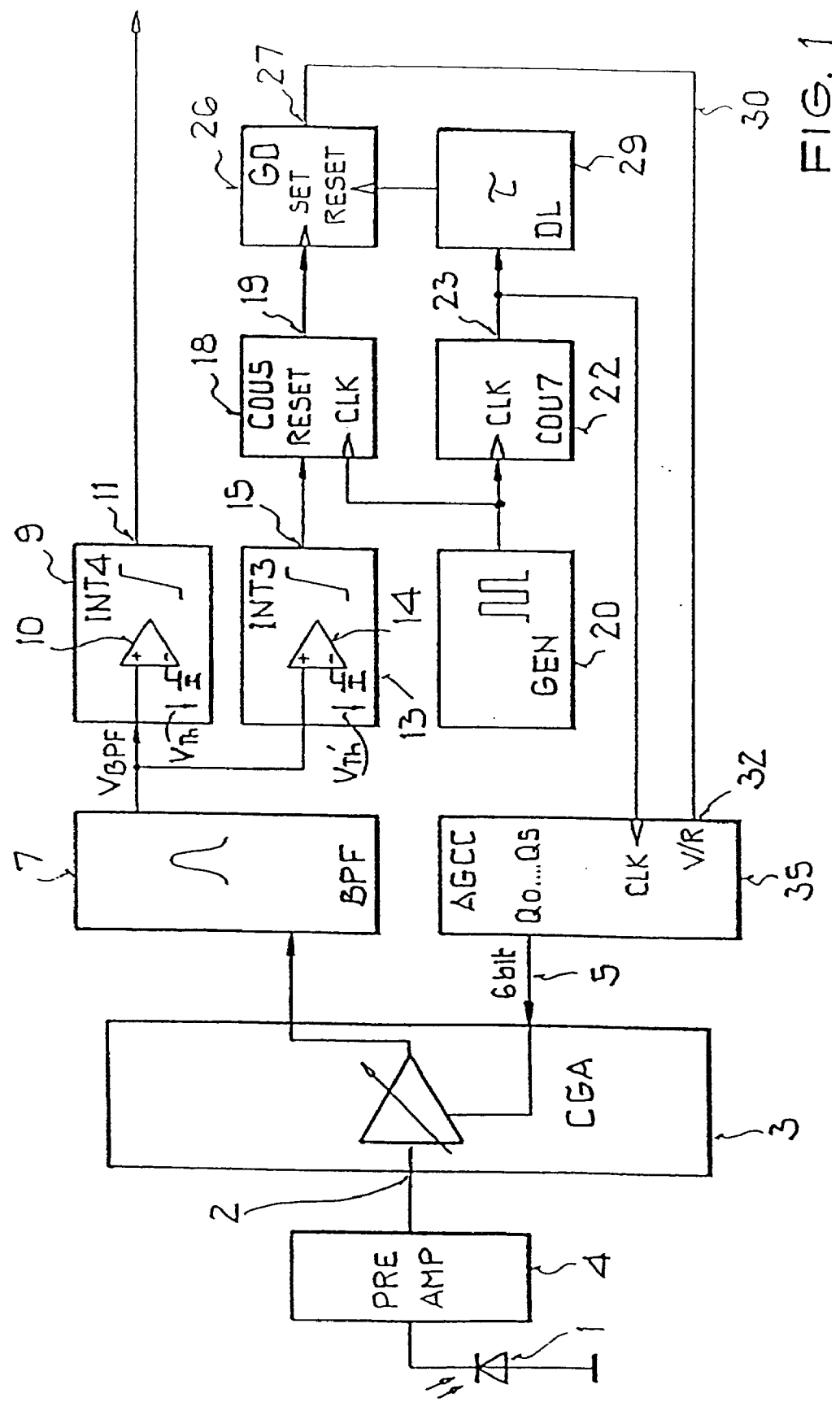
FIG. 1 shows a block diagram of a pre-amplifier circuit for digital signals that may originate from a light receiver, particularly an IR light receiver; the pre-amplifier circuit includes a device for recognizing interfering signals, as well as a device for influencing an automatic amplification regulation such that useful signals can be supplied, separately from the interfering signals, for further processing.

In FIG. 1, the signal originating from, for example, an IR photodiode 1 is supplied to a pre-amplifier 4. The circuit contained in the pre-amplifier 4 separates low-frequency current components of the photodiode 1 (0 to about 20 kHz), as are formed by incandescent light or sunlight, from the useful signal. Higher-frequency current components of the photodiode 1 (higher than about 20 kHz) are converted into an equivalent voltage and supplied to a signal input 2 of an amplifier 3 (CGA). Next, the signal travels to an amplifier 3 (CGA), whose amplification can be set by way of a line 5, specifically via a six-bit-wide data word. The amplified output signal travels from the amplifier 3 to a band-pass 7 (BPF), which allows a specific, defined frequency band (corresponding to the used carrier frequency) to pass unhindered. Frequencies outside of this frequency band are damped. The output of the bandpass filter 7 is connected on one side to an input of a first integrator 9 (INT 4) and on the other side to an input of a second integrator 13 (INT 3).

Internally, the first integrator 9 is embodied such that the input signal for the first integrator is supplied to the non-inverting input of an operational amplifier 10, whose inverting input is held at a predetermined threshold voltage VTh relative to ground; the arrangement is such that the operational amplifier 10 only allows the signal through if the signal supplied to the non-inverting input is positive with respect to ground and is larger than the amount of the threshold voltage VTh. Hence, a half-wave rectification is performed in the region of the input of the first integrator 9, and only signals having a minimum size VTh are allowed through to the further devices of the first integrator. The first integrator 9 is embodied such that it integrates the signal present at the output of the operational amplifier 10 to keep interferences due to noise voltages as small as possible, and only generates a signal having the value of logical 1 at an output 11 of the first integrator 9 if four directly-consecutive pulses of the carrier frequency of 30 kHz have been recognized.

The integration is effected by a forward/backward counter in the first integrator 9, which only counts to four if four consecutive pulses of the carrier frequency are supplied to it. Directly-consecutive pulses have an interval of about 35 $\mu$s, and about 100 $\mu$s pass between the first and the fourth directly-consecutive pulses of the carrier frequency. If the output 11 has been switched to logical 1, it is not switched back to logical 0 until no pulse can be detected at three not necessarily consecutive times at which pulses could be present (about every 35 $\mu$s). This is also determined by the forward/backward counter in the first integrator 9. The output 11 constitutes the data output of the circuit shown in the figure, and, as will become apparent later in the description, a useful signal that is normally completely freed from interfering pulses is available at this data output.

The useful signal at the output 11 is the envelope of the carrier-frequency signal, and is delayed with respect to it by four pulses of the carrier frequency.

A second integrator 13 (INT 3) is provided, with a threshold-value circuit that is formed by an operational amplifier 14 being disposed upstream of the integrator input, similarly to the first integrator 9 (INT 4); the threshold value VTh' of the circuit is 0.7 times the threshold value VTh of the operational amplifier 10. The second integrator 13 also performs the integration by means of a counter. The second integrator 13 supplies an output signal that corresponds to the envelope of the carrier-frequency information supplied to the integrator if the comparator threshold VTh' is exceeded three times in series. If the threshold value VTh' is not attained, the second integrator 13 is reset, that is, its output is again set at logical zero.

The output signal of the second comparator 13 is available at an output 15, and is supplied to a five-bit counter 18 (COU5), specifically to its reset input (RESET). The output of a clock generator 20 (GEN) is connected to a clock input (CLK) of the counter 18, which provides a clock of 1.33 kHz. The output of the clock generator 20 is also connected to the clock input (CLK) of a seven-bit counter 22 (COU7). The five-bit counter 18 is a forward counter, and counts one count further for each positive flank at the input CLK. The counter 18 is asynchronously reset by a signal at the RESET input. When a count 32 is attained, the counter 18 supplies a short trigger signal at its output 19. When the count 32 is attained, the next clock pulse supplied to the input CLK results in the count 0.

The seven-bit counter 22 is a forward counter, and counts one count further for each positive flank at its input CLK. When the count 128 has been attained, the counter supplies a short trigger signal at its output 23. When the count 128 is attained, the next clock pulse supplied to the input CLK results in the count 0.

The output signal of the counter 18 is supplied to a set input (SET) of a gap-recognition memory 26 (GD). This memory operates like an RS flip-flop. The output 27 is set at the value of logical 1 by a signal at the set input, and is reset by a signal at the reset input (RESET). This resetting is effected by way of the pulse supplied by the output of the counter 22 and supplied to the reset input of the memory (26), slightly delayed by a delay device 29 (DL).

The output signal of the memory 26 is supplied via a line 30 to a forward/backward control input 32 (V/R) of a counter 35 for regulating the amplification of the amplifier 3. The counter 35 (AGCC) is a six-bit forward/backward counter that sets the amplification of the amplifier 3 (CGA). A positive flank supplied to the clock input (CLK) of the counter 35 from the output of the seven-bit counter 22 effects a change in the count by one counting step. The logical state at the input V/R determines the counting direction.

The clock frequency of 1.33 kHz of the generator 20 corresponds to a pulse interval of about 0.75 ms. As described above, the circuit operates with a time span Td=24 ms. It is assumed that an interference is present when no pauses longer than Td occur in a lengthy time segment (T check=96 ms). A useful signal is assumed if pauses longer than Td occur in a lengthy time segment (T check). The time T check=96 ms is generated by the seven-bit counter 22. If the second integrator 13 (INT 3) supplies no signal for a time span of T=24 ms, a trigger signal is formed at the output of the five-bit counter 18. This trigger signal now sets the memory 26. Its output now indicates that a pause T>24 ms has occurred. This output signal serves as the input signal that determines the counting direction for the counter 35 (AGCC). When the output of the memory 26 is set, the counter 35 counts backward by one count when a clock reaches its input CLK. This increases the amplification of the amplifier 3 by one dB. If the output of the memory 26 is not set when a clock reaches the clock input CLK of the counter 35, the counter 35 counts higher by one count. This reduces the amplification of the amplifier 3 by one dB.

The delay line 29 ensures that the memory 26 is not reset until the counter 35 has counted.

Hence, the following function results for the output of the second integrator 13 (INT 3):

The passed time span of T check=96 ms is investigated In a fixed time pattern of T check=96 ms. If a signal gap of T>Td (and thus a pause of T>Td) occurred at the output of the second integrator 13 during this time span, the amplification of the amplifier 3 and therefore the amplification of the entire arrangement are increased by 1 dB. If no such gap occurred during this time span, the amplification of the amplifier 3 is reduced by 1 dB.

The signals to be assessed pass through the amplifier 3 and the band-pass 7. Afterward, the signals pass through the first integrator 9 (with a sufficient amplitude) and, parallel to this, through the second integrator 13. The amplifier 3 possesses a regulating dynamics of dV=63 dB, corresponding to the possible counts of the counter 35 (AGCC). The following features are especially critical:

The amplification of the band-pass 7 is constant (with the use of passive components, the amplification is about 1). The first integrator 9 permits signals that are larger than VTh to pass. The second integrator 13 permits signals that are larger than VTh' to pass its input.

The output of the first integrator 9 is the data output. This output makes the digital data word serially available, corresponding to the incoming remote operation signals. In a steady-state regulation, network-synchronous interfering signals do not lead to a switching of this output, i.e., this output is essentially free of interferences in a steady-state regulation.

The above-described function features of the regulation result in the following control response:

When synchronous signals with T<24 ms are received, they first come through at the data output of the first integrator 9.

Now the amplification of the amplifier 3 is reduced by steps of 1 dB in an interval of T check=96 ms until the signal amplitude at the output of the band-pass 7 becomes smaller than VTh'. No signal appears now at the output 15 of the second integrator 13. The signal amplitude VBPF of the signal exiting the band-pass 7 oscillates around this value, because the counter 35 constantly changes its counting direction for the automatic amplification regulation. When the signal amplitude is smaller than VTh', the above-described pauses are recognized, which effects an increased amplification. The threshold of the operational amplifier 14 of the second integrator 13 is consequently exceeded again, and the procedure is repeated. The amplification is now adjusted. The signal amplitude VBPF corresponds to the voltage VTh'. Because the first integrator 9 only allows signals that are larger than VTh (corresponding to the larger threshold value) to pass, these interfering signals no longer pass through to the output of the first integrator 9.

When remote operation signals are received, pauses longer than Td=24 ms always occur within T check=96 ms. Therefore, the amplification of the amplifier 3 is increased until the maximum amplification has been attained, or interfering signals or noises exceed the threshold value VTh' so often that only one pause with T>Td still occurs within a time interval of T=2×T check in the statistical means. In this case, the amplifier 3 is readjusted, because the counting direction of the counter 35 is compensated in the statistical means. In this state, the signal voltage VBPF is so large that both the threshold VTh' and the threshold VTh are exceeded. Thus, the signals pass through to the data output 11 via the first integrator 9.

The output signal of the band-pass filter 7 has no DC voltage component. It therefore oscillates around a zero level. The maximum regulation time for regulating the amplifier 3 from its minimum amplification to the maximum amplification, or vice versa, is 63×96 ms≈6 s. The automatically-regulated amplification of the amplifier 3 is reset every 96 ms. The change is always in the amount of a counter setting of the counter 35, thus always 1 dB in the example. With minimum amplification of the amplifier 3, the range of the IR transmitter should be even greater than one meter so that very long pulse sequences, as can occur in the programming of the device, can be processed.

The difference between the threshold voltages of the two integrators 9 and 13 in the example of 30% is selected such that interfering pulses only appear so rarely at the data output 11 that this does not impair the usability of the remote control.

The two relevant threshold values of the integrators are very close together. Hence, offset errors cannot be perceived very easily.

The arrangement can be embodied as an integrated circuit, with the photodiode usefully being a separate component.

What is claimed is:

1. A method of recognizing a network-synchronous interfering signal during a data transmission in which pauses occur between useful signals, with the duration of a shortest pause being Tp and a main frequency being f, comprising the steps of:
   defining a time span Td being shorter than the shortest pause Tp, but longer than the longest period 1/f or ½f, of a network-synchronous interfering station;
   determining whether pauses occur that are longer than Td during a time period T check>Td; and
   interpreting an occurrence of pauses as the presence of a useful signal without a network-synchronous interfering signal, and interpreting a lack of an occurrence of pauses as the presence of an interfering signal.

2. The method according to claim 1, wherein time period T check is a multiple of time span Td.

3. The method according to claim 1, wherein time period T check is four times Td.

4. The method according to claim 1, further comprising the step of conducting further a useful signal, independently of the determination of said pause and only when a predetermined amplitude is exceeded.

5. The method according to claim 4, further comprising the step of evaluating the interfering signal only when a further, predetermined amplitude is exceeded, the amplitude being smaller than the first-mentioned amplitude of the useful signal for ascertaining the absence of pauses.

6. The method according to claim 5, further comprising the step of subjecting the useful signal and the interfering signal together to an amplification regulation, by means of which, in a steady-state regulation, the interfering signal is regulated to such an amplitude that the presence and absence of pauses>Td is ascertained about equally frequently in the temporal means.

7. A device for recognizing network-synchronous interfering signals during a data transmission, in which pauses occur between useful signals, with the period of a shortest pauses being Tp and a main frequency being f, comprising:
   a means for defining a time span Td, being shorter than the shortest pause Tp, but longer than the longest period 1/f or ½f, of a network-synchronous interfering station;
   a means for determining whether pauses occur that are longer than Td during a time period T check>Td; and
   a means for interpreting an occurrence of pauses as the presence of a useful signal without a network-synchronous interfering signal, and interpreting a lack of occurrence of pauses as the presence of an interfering signal.

8. The device according to claim 7, wherein time period T check is a multiple of time span Td.

9. The device according to claim 8, wherein the device operates digitally.

10. The device according to claim 7, wherein time period T check is four times Td.

11. The device according to claim 10, wherein the device operates digitally.

12. The device according to claim 7, further comprising a means for providing an amplitude threshold in the signal path of the useful signal, the threshold only permitting an evaluation of the useful signal if the amplitude of the useful signal at the output of a band-pass is larger than the amplitude of the interfering signal.

13. The device according to claim 12, further comprising a means for providing an amplitude threshold in the evaluation path of the interfering signal, the threshold being smaller than the amplitude threshold provided in the signal path of the useful signal.

14. The device according to claim 13, further comprising a means for switching an amplifier, whose amplification can be regulated, into the signal path of the useful signal and interfering signal, the amplifier's amplification being regulated such that the amplitude of the interfering signal is identical to the threshold value of the amplitude threshold for the interfering signal.

15. The device according to claim 14, further comprises a device for increasing the amplification of the amplifier when no interfering signal is recognized, and reduces the amplification of the amplifier when an interfering signal is recognized.

16. The device according to claim 15, wherein the device operates digitally.

17. The device according to claim 12, wherein the device operates digitally.

18. The device according to claim 13, wherein the device operates digitally.

19. The device according to claim 14, wherein the device operates digitally.

20. The device according to claim 7, wherein the device operates digitally.

* * * * *